(12) United States Patent
Wang et al.

(10) Patent No.: US 12,218,261 B2
(45) Date of Patent: Feb. 4, 2025

(54) InGaN/GaN MULTIPLE QUANTUM WELL BLUE LIGHT DETECTOR COMBINED WITH EMBEDDED ELECTRODE AND PASSIVATION LAYER STRUCTURE AND PREPARATION METHOD AND APPLICATION THEREOF

(71) Applicant: SOUTH CHINA UNIVERSITY OF TECHNOLOGY, Guangzhou (CN)

(72) Inventors: Wenliang Wang, Guangzhou (CN); Guoqiang Li, Guangzhou (CN); Baiyu Su, Guangzhou (CN); Zhengliang Lin, Guangzhou (CN); Deqi Kong, Guangzhou (CN); Wenjin Mai, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 378 days.

(21) Appl. No.: 17/732,524

(22) Filed: Apr. 29, 2022

(65) Prior Publication Data

US 2022/0328706 A1 Oct. 13, 2022

Related U.S. Application Data

(63) Continuation of application No. PCT/CN2022/083521, filed on Mar. 28, 2022.

(30) Foreign Application Priority Data

Apr. 12, 2021 (CN) .......................... 202110390252.X

(51) Int. Cl.
H01L 31/02 (2006.01)
H01L 31/0224 (2006.01)
(Continued)

(52) U.S. Cl.
CPC .................. H01L 31/02363 (2013.01); H01L 31/022408 (2013.01); H01L 31/035236 (2013.01);
(Continued)

(58) Field of Classification Search
CPC ....... H01L 31/02363; H01L 31/022408; H01L 31/035236; H01L 31/0392;
(Continued)

(56) References Cited

U.S. PATENT DOCUMENTS 5,405,797 A * 4/1995 Brugger ............... H01L 27/0605
257/E27.012
6,291,277 B1 * 9/2001 Baudet .............. H01L 29/66462
257/E23.179
(Continued)

*Primary Examiner* — Ida M Soward
(74) *Attorney, Agent, or Firm* — JCIPRNET

(57) ABSTRACT

An InGaN/GaN multiple quantum well blue light detector-includes: a Si substrate, an AlN/AlGaN/GaN buffer layer, a u-GaN/AlN/u-GaN/SiN$_x$/u-GaN buffer layer, an n-GaN buffer layer, an InGaN/GaN superlattice layer and an InGaN/GaN multiple quantum well layer in sequence from bottom to top. The multiple quantum well layer has a groove and a mesa, the mesa and the groove of the multiple quantum well layer are provided with a Si$_3$N$_4$ passivation layer. The (Continued)

passivation layer in the groove is provided with a first metal layer electrode with a semicircular cross section, and the passivation layer on the mesa is provided with second metal layer electrode.

15 Claims, 2 Drawing Sheets

(51) Int. Cl.
    *H01L 31/0236*    (2006.01)
    *H01L 31/0352*    (2006.01)
    *H01L 31/0392*    (2006.01)
    *H01L 31/18*    (2006.01)
    *H01L 31/0304*    (2006.01)

(52) U.S. Cl.
    CPC ...... *H01L 31/0392* (2013.01); *H01L 31/1848* (2013.01); *H01L 31/1864* (2013.01); *H01L 31/03044* (2013.01); *H01L 31/03048* (2013.01); *H01L 31/1852* (2013.01)

(58) Field of Classification Search
    CPC ......... H01L 31/03044; H01L 31/03048; H01L 31/02161; H01L 31/035281
    See application file for complete search history.

(56) References Cited

U.S. PATENT DOCUMENTS

| | | | | |
|---|---|---|---|---|
| 6,307,221 | B1* | 10/2001 | Danzilio | H01L 29/7787 438/168 |
| 2004/0257894 | A1* | 12/2004 | Onogi | B82Y 10/00 |
| 2005/0145883 | A1* | 7/2005 | Beach | H01L 29/7835 257/194 |
| 2005/0179036 | A1* | 8/2005 | Yamazaki | H01L 29/78678 257/E21.414 |
| 2007/0176204 | A1* | 8/2007 | Murata | H01L 29/7843 257/E29.253 |
| 2009/0321854 | A1* | 12/2009 | Ohta | H01L 29/66462 257/411 |
| 2012/0181548 | A1* | 7/2012 | Okada | H01L 29/66462 257/E29.246 |
| 2014/0264705 | A1* | 9/2014 | Ozaki | H01L 27/14652 257/443 |
| 2015/0060942 | A1* | 3/2015 | Kume | H01L 29/7813 257/190 |
| 2016/0071967 | A1* | 3/2016 | Prechtl | H01L 29/1075 438/172 |
| 2017/0148906 | A1* | 5/2017 | Iucolano | H01L 21/0254 |
| 2020/0035843 | A1* | 1/2020 | Zhao | H01L 31/035236 |

* cited by examiner

InGaN/GaN MULTIPLE QUANTUM WELL BLUE LIGHT DETECTOR COMBINED WITH EMBEDDED ELECTRODE AND PASSIVATION LAYER STRUCTURE AND PREPARATION METHOD AND APPLICATION THEREOF

CROSS-REFERENCE TO RELATED APPLICATION

This application is a continuation of international application of PCT application serial no. PCT/CN2022/083521 filed on Mar. 28, 2022, which claims the priority benefit of China application no. 202110390252.X, filed on Apr. 12, 2021. The entirety of each of the above mentioned patent applications is hereby incorporated by reference herein and made a part of this specification.

BACKGROUND

Technical Field

The present invention belongs to the field of visible light detectors, in particular to an InGaN/GaN multiple quantum well (MQW) blue light detector combined with embedded electrode and passivation layer structure, a preparation method and application thereof.

Description of Related Art

Group III nitride semiconductor materials have excellent optical, electrical, thermal, chemical and mechanical properties. Therefore, group III nitride optoelectronic devices and power devices have been widely concerned and focused by researchers at home and abroad.

InGaN, as one of the research hotspots of the third generation semiconductor materials, has good physical and chemical properties. It has high electron mobility, good thermal stability and good chemical stability. By adjusting the composition of In in an alloy, a band gap can be continuously adjusted from 3.4 eV to 0.7 eV, thereby enabling InGaN photodetector to accomplish continuous detection covering the whole visible light band. Compared with photomultiplier tube, InGaN detector has the advantages of small size, easy portability, easy integration, high breakdown electric field (>1 MV/cm), low working voltage, energy saving and environmental protection, and no need of filter system.

Although the research on InGaN-based detectors has been widely carried out, up to now, the commercial conversion has not been realized. InGaN materials with high In composition are prone to phase separation and large lattice mismatch with the substrate, which is prone to defects and cracks. The fabricated devices will have large dark current due to the surface state of InGaN materials, and defects will affect the responsivity of devices. Therefore, the fundamental problem that restricts the development and application of InGaN detectors is material quality, and the key problem is device optimization.

Some researchers use InGaN/GaN multiple quantum well materials to prepare blue light detectors, which have a response time of 300 ms, a dark current of $10^{-7}$ A, a defect density of 106 $cm^{-3}$, and a peak responsivity of 0.35 A/W at 5 V voltage. However, due to the existence of dangling bonds on the material surface, the dark current of the device is still high. At the same time, the defect density and responsivity still cannot meet the demands.

To address the above deficiencies, the present invention reduces material defects through a multi-layer buffer layer technology, designs a quantum well structure to inhibit phase separation of InGaN materials, and achieves the growth of thin films in high quality. At the same time, the present invention combines the embedded electrode and passivation layer structure to optimize device performance from the perspectives of reducing dark current, enhancing illumination intensity and the like, and achieves a high-performance device.

SUMMARY

In order to overcome the shortcomings and deficiencies of the prior art, the present invention aims to provide a preparation method of an InGaN/GaN multiple quantum well (MQW) visible light detector combined with embedded electrode and passivation layer structure. The method has the advantages of good quality of growing an InGaN/GaN multiple quantum well film, high external quantum efficiency of the device, fast response speed, high bandwidth and the like.

Due to the large lattice mismatch between an InGaN material and a substrate, defects are easy to occur, and phase separation is easy to occur during growth. A multi-layer buffer layer structure can reduce material defects and cracks caused by lattice mismatch, while the InGaN/GaN multiple quantum well structure can release stress and inhibit phase separation, which can improve the quality of functional layer. Device optimization is achieved by combining the embedded electrode. A $Si_3N_4$ passivation layer is used to reduce the leakage current on the InGaN surface, and a structure of an embedded anode electrode is combined to improve the vertical electric field distribution and enhance the collection ability of photo-generated carriers. By combining the two structures, on the one hand, the preparation of embedded anode electrode requires etching, which will cause surface damage, and the surface leakage current caused by surface damage can be effectively reduced by passivation layer. On the other hand, the preparation of passivation layer in a groove can realize multiple reflections of light, directly enhance the illumination intensity of the InGaN material, increase the number of photo-generated carriers, and obtain high-performance blue light detectors.

The purpose of the present invention is realized by the following technical solution:

An InGaN/GaN multiple quantum well blue light detector combined with embedded electrode and passivation layer structure includes: a Si substrate, an AlN/AlGaN/GaN buffer layer, a u-GaN/AlN/u-GaN/$SiN_x$/u-GaN buffer layer, an n-GaN buffer layer, an InGaN/GaN superlattice layer and an InGaN/GaN multiple quantum well layer in sequence from bottom to top; and the InGaN/GaN multiple quantum well layer has a groove structure, a mesa and a groove of the InGaN/GaN multiple quantum well layer are provided with a $Si_3N_4$ passivation layer, the $Si_3N_4$ passivation layer in the groove is provided with a first metal layer electrode with a semicircular cross section, and the $Si_3N_4$ passivation layer on the mesa is provided with a second metal layer electrode.

Preferably, the Si substrate has a thickness of 520 to 530 μm.

Preferably, the AlN/AlGaN/GaN buffer layer includes an AlN layer with a thickness of 300-400 nm, an AlGaN layer with a thickness of 600-700 nm and a GaN layer with a thickness of 300-400 nm.

Preferably, the u-GaN/AlN/u-GaN/$SiN_x$/u-GaN buffer layer includes a u-GaN layer with a thickness of 300-400 nm, an AlN layer with a thickness of 200-300 nm, a u-GaN layer with a thickness of 300-400 nm, a $SiN_x$ layer with a thickness of 400-600 nm and a u-GaN layer with a thickness of 300-400 nm.

Preferably, the n-GaN buffer layer has a thickness of 2-3 μm.

Preferably, the InGaN/GaN superlattice layer has a thickness of 500-600 nm with an alternating arrangement structure.

Preferably, the InGaN/GaN multiple quantum well layer has a thickness of 170-340 nm. Further preferably, the InGaN/GaN multiple quantum well layer has a thickness of 180-260 nm.

Preferably, the $Si_3N_4$ passivation layer has a thickness of 5-20 nm.

Preferably, the first metal layer electrode and the second metal layer electrode are Ni/Au metal layer electrodes, the Ni/Au metal layer electrode including a Ni metal layer with a thickness of 70-90 nm and an Au metal layer with a thickness of 70-90 nm.

Preferably, the InGaN/GaN multiple quantum well layer is in a form of superimposing a layer of InGaN on a layer of GaN with superimposing for 9-12 times as a period, the GaN layer with a thickness of 13-18 nm, and the InGaN layer with a thickness of 6-10 nm.

Preferably, the InGaN/GaN superlattice layer is in a form of superimposing a layer of InGaN on a layer of GaN with superimposing for 9-11 times as a period, the GaN layer with a thickness of 40-48 nm, and the InGaN layer with a thickness of 10-12 nm.

Preferably, the first metal layer electrode and the second metal layer electrode are interdigital electrodes, the first metal layer electrode and the second metal layer electrode being alternately arranged.

Preferably, the groove structure is a strip-shaped structure with equal spacing, the groove has a width of 100-150 nm and a depth of 160-200 nm, and a distance between center lines of two grooves is 400-650 nm.

Preferably, the first metal layer electrode is a semicircular electrode with a cross section radius of 100-140 nm.

Preferably, an overall length-width dimension of the detector is 5.2×5.2 to 8.45×8.45 μm².

A preparation method of the InGaN/GaN multiple quantum well blue light detector combined with embedded electrode and passivation layer structure includes the following steps.

Step (1) growing an AlN/AlGaN/GaN buffer layer, a u-GaN/AlN/u-GaN/$SiN_x$/u-GaN buffer layer, an n-GaN buffer layer, an InGaN/GaN superlattice layer and an InGaN/GaN multiple quantum well layer on a Si substrate by MOCVD.

Step (2) performing Inductively Coupled Plasma (ICP) etching on the InGaN/GaN multiple quantum well layer obtained in step (1) to obtain a groove structure.

Step (3) performing Plasma Enhanced Chemical Vapor Deposition (PECVD) to deposit a $Si_3N_4$ passivation layer on the InGaN/GaN multiple quantum well layer with the groove structure obtained in step (2).

Step (4) photoetching the $Si_3N_4$ passivation layer obtained in step (3) by firstly coating evenly and drying, then exposing and developing, and finally undergoing oxygen ion treatment.

Step (5) evaporating the groove and the mesa of the $Si_3N_4$ passivation layer obtained in step (4), first evaporating Ni and then evaporating Au, taking out and cleaning to obtain the InGaN/GaN multiple quantum well blue light detector.

Preferably, the AlN/AlGaN/GaN buffer layer in step (2) includes an AlN layer grown at a temperature of 1000-1100° C., an AlGaN layer grown at a temperature of 1000-1100° C. and a GaN layer grown at a temperature of 900-1050° C.

Preferably, the u-GaN/AlN/u-GaN/$SiN_x$/u-GaN buffer layer includes a u-GaN layer grown at a temperature of 900-1050° C., an AlN layer grown at a temperature of 1000-1100° C., a u-GaN layer grown at a temperature of 900-1050° C., a $SiN_x$ layer grown at a temperature of 1000-1100° C. and a u-GaN layer grown at a temperature of 900-1050° C.

Preferably, the n-GaN buffer layer is grown at a temperature of 900-1050° C.

Preferably, the InGaN/GaN superlattice layer and the InGaN/GaN multiple quantum well layer are grown at a temperature of 550-760° C.

Preferably, in step (4), a drying time is 35-48 s, an exposure time is 4-12 s, a developing time is 35-48 s, and an oxygen ion treatment time is 1.5-3.5 min.

Preferably, a rate of the evaporation in step (5) is 0.16-0.22 nm/min.

Preferably, a heating temperature in step (5) is 1455-1555° C.

The above-mentioned InGaN/GaN multiple quantum well blue light detector combined with embedded electrode and passivation layer structure is applied in blue light detection.

The design for the InGaN/GaN multiple quantum well blue light detector of the present invention is as follows.

(1) Design and optimization of InGaN/GaN multiple quantum well (MQW) array growth structure: since the large lattice mismatch (>17%) and thermal mismatch (>54%) between the Si substrate and the InGaN material, the material is prone to high-density defects and cracks. By designing an AlN/AlGaN/GaN buffer layer, a u-GaN/AlN/u-GaN/$SiN_x$/u-GaN buffer layer and an n-GaN buffer layer, the lattice mismatch is reduced and the stress and defect density of epitaxial layers are controlled. At the same time, the design of the InGaN/GaN superlattice layer and the InGaN/GaN multiple quantum well layer structure can inhibit phase separation and improve the quality of the InGaN material.

(2) High quality InGaN materials are grown on the Si substrate by MOCVD: the AlN/AlGaN/GaN buffer layer, the u-GaN/AlN/u-GaN/$SiN_x$/u-GaN buffer layer and the n-GaN buffer layer are grown on the Si substrate by MOCVD at a high temperature, and then the InGaN/GaN superlattice layer and the InGaN/GaN multiple quantum well layer are grown on the buffer layer to realize the growth of high quality InGaN materials.

(3) Optimal design of the InGaN/GaN multiple quantum well (MQW) blue light detector combined with the embedded electrode and passivation layer structure and its array periodic structure: designing the device structure of the InGaN/GaN multiple quantum well (MQW) blue light detector, adjusting the chip unit's structure size and parameters, array periodic structures, etc. By using the $Si_3N_4$ passivation layer to reduce the leakage current on InGaN surface, and combining with the embedded anode electrode structure, the electrode at grooves are locally heated by a resistance heating method to be melted to form a semicircular shape, which can cause reflection of incident light irradiate on the electrode to be reflected on a functional layer, thereby improving the vertical electric field distribution, improving the collecting ability of the electrode to photo-generated carriers. By combining the two structures, on the one hand, the preparation of embedded anode electrode requires etching, which will cause a damage, and the surface leakage current caused by surface damage can be effectively reduced by passivation layer. On the other hand, the passivation layer prepared in the groove also has a function of antireflection. This whole structure can lead to multiple reflections, antireflection and utilization of light, directly enhance the absorption intensity of the InGaN materials and increase the number of photo-generated carriers, thereby realizing high-performance devices.

(4) Preparation of the InGaN/GaN multiple quantum well (MQW) blue light detector combined with the embedded electrode and passivation layer structure: to optimize the fabrication process of the detector, ICP etching was used to form grooves on the functional layer, and PECVD is used to deposit a thin $Si_3N_4$ passivation layer on a plane, a sidewall and the grooves. Finally, a Ni/Au anode embedded electrode and a Ni/Au cathode mesa electrode are fabricated on the grooves and mesa of the InGaN/GaN multiple quantum well layer by photolithography evaporation process. The influence on the performance of InGaN/GaN multiple quantum well (MQW) blue light detector combined with embedded electrode and passivation layer structure is explored by changing the time of exposure, baking, development, oxygen ion treatment, electrode types, thickness and evaporation rate and other process parameters in the photolithography process, so as to improve the sensitivity and responsivity of the detector and realize the preparation of a high-performance blue light detector.

Compared with the prior art, the present invention has the following advantages and excellent effects.

(1) An InGaN/GaN multiple quantum well (MQW) blue light detector combined with embedded electrode and passivation layer structure of the present invention provides a method for growing an AlN/AlGaN/GaN buffer layer, a u-GaN/AlN/u-GaN/SiN$_x$/u-GaN buffer layer and an n-GaN buffer layer on a Si substrate by adopting a MOCVD high-temperature epitaxy method. Then, an InGaN/GaN superlattice layer and an InGaN/GaN multiple quantum well layer are grown on the buffer layer, a thin $Si_3N_4$ passivation layer is deposited on the plane, sidewall and groove by PECVD. Finally, a Ni/Au anode embedded electrode is fabricated in the groove of the InGaN/GaN functional layer by photolithography evaporation process, and Ni/Au cathode mesa electrodes are fabricated on the mesa, thereby realizing the InGaN/GaN multiple quantum well (MQW) blue light detector combined with the embedded electrode and passivation layer structure. The preparation method features simple process, time saving, high efficiency and low power consumption, and is beneficial to large-scale production.

(2) The InGaN/GaN multiple quantum well (MQW) blue light detector combined with the embedded electrode and passivation layer structure of the present invention realizes the control of InGaN material composition and defect density through a multi-layer buffer layer technology, and ensures the growth of high-quality InGaN material with controllable composition. The design of the InGaN/GaN multiple quantum well layer structure suppresses the phase separation problem of the InGaN materials and achieves the high-speed response in blue light band. On this basis, the blue light detector and array structure are optimized, which effectively improves the response speed and greatly reduces the volume of the optical system at the receiving end.

(3) The InGaN/GaN multiple quantum well (MQW) blue light detector combined with the embedded electrode and the passivation layer structure achieves device optimization by combining the embedded electrode and the passivation layer structure, where a $Si_3N_4$ passivation layer is used to reduce the leakage current on the InGaN surface, and a structure of an embedded anode electrode is combined to improve the vertical electric field distribution and enhance the collecting ability of photo-generated carriers. By combining the two structures, on the one hand, the preparation of embedded anode electrode requires etching, which will cause surface damage, and the surface leakage current caused by surface damage can be effectively reduced by passivation layer. On the other hand, the preparation of passivation layer in a groove can realize multiple reflections of light, directly enhance the illumination intensity of the InGaN material, and increase the number of photo-generated carriers, which improves a quantum efficiency in the blue light band and enhances resonant absorption of blue light, and achieves high sensitivity and high bandwidth detection.

DESCRIPTION OF THE EMBODIMENTS

The present invention will be described in further detail below in connection with embodiments, but the embodiments of the present invention are not limited thereto.

Figure 1:
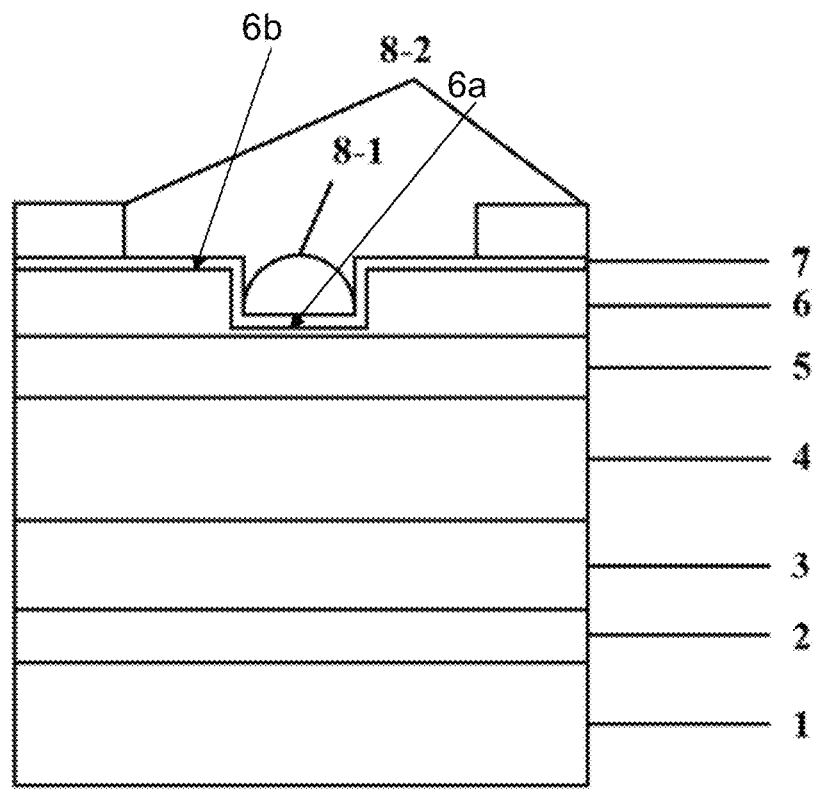
FIG. 1 is a cross-sectional diagram of a partial interdigital electrode structure of an InGaN/GaN multiple quantum well (MQW) blue light detector of the present invention.

In a specific embodiment, the structural cross-sectional diagram of the InGaN/GaN multiple quantum well (MQW) blue light detector of the present invention is shown in FIG. 1. As can be seen from FIG. 1, from bottom to top, it successively includes a Si substrate 1, an AlN/AlGaN/GaN buffer layer 2, a u-GaN/AlN/u-GaN/SiN$_x$/u-GaN buffer layer 3, an n-GaN buffer layer 4, an InGaN/GaN superlattice layer 5, an InGaN/GaN multiple quantum well layer 6 with a groove 6a and a mesa 6b, a $Si_3N_4$ passivation layer 7, and a first Ni/Au metal layer electrode 8-1 and second Ni/Au metal layer electrode 8-2. The first Ni/Au metal layer electrode is located in the groove 6a and the second Ni/Au metal layer electrodes are located on the mesa 6b both sides of the planar groove, wherein the Si substrate 1 has a thickness of 520-530 μm; the AlN/AlGaN/GaN buffer layer 2 includes an AlN layer, an AlGaN layer and a GaN layer with thicknesses of 300-400 nm, 600-700 nm and 300-400 nm, respectively; the u-GaN/AlN/u-GaN/SiN$_x$/u-GaN buffer layer 3 includes a u-GaN layer, an AlN layer, a u-GaN layer, a SiN$_x$ layer and a u-GaN layer with thicknesses of 300-400 nm, 200-300 nm, 300-400 nm, 400-600 nm and 300-400 nm, respectively; the n-GaN buffer layer 4 has a thickness of 2-3 μm; the InGaN/GaN superlattice layer 5 has a thickness of 500-600 nm; the InGaN/GaN MQW layer 6 has a thickness of 180-260 nm, and is in a form of superimposing a layer of InGaN on a layer of GaN with superimposing for 9-12 times as a period, the GaN layer has a thickness of 13-18 nm, and the InGaN layer has a thickness of 6-10 nm; the $Si_3N_4$ passivation layer 7 has a thickness of 5-20 nm; the Ni/Au metal layer electrode includes a Ni metal layer and an Au metal layer, the Ni metal layer has a thickness of 70-90 nm, and the Au metal layer has a thickness of 70-90 nm.

Figure 2:
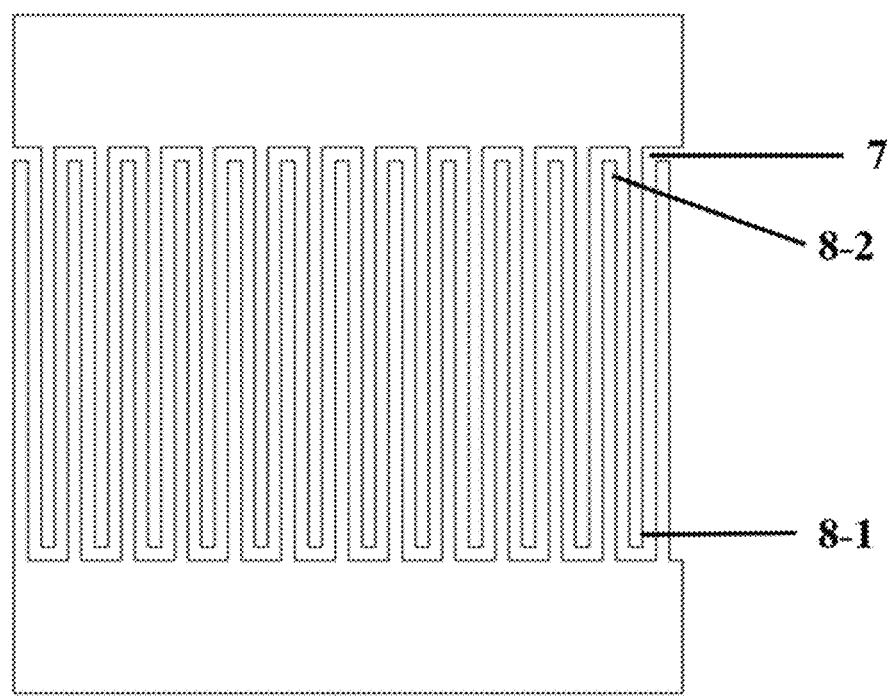
FIG. 2 is a schematic plan view of an electrode structure of the InGaN/GaN multiple quantum well (MQW) blue light detector of the present invention.

A schematic plan view of an electrode structure of the InGaN/GaN multiple quantum well (MQW) blue light detector of the present invention is shown in FIG. 2, the first metal layer electrode and the second metal layer electrodes are interdigital structure electrodes; the groove structure is a strip-shaped structure with equal spacing, the groove has a width of 100-150 nm and a depth of 160-200 nm, and a distance between center lines of two grooves is 400-650 nm, and a radius of the semicircular electrode is about 100-140 nm; and an overall size of the detector is 5.2×5.2 to 8.45×8.45 µm².

Embodiment 1

The InGaN/GaN multiple quantum well (MQW) blue light detector and the preparation method thereof of the embodiment include the following steps.

(1) Firstly, according to the structure design, an AlN/AlGaN/GaN buffer layer, a u-GaN/AlN/u-GaN/SiN$_x$/u-GaN buffer layer and an n-GaN buffer layer are grown at high temperature on a Si substrate by MOCVD at temperatures of 1000° C., 1000° C., 900° C., 900° C., 1000° C., 900° C., 1000° C., 900° C. and 900° C., respectively. The thin film thicknesses of the AlN/AlGaN/GaN buffer layer, u-GaN/AlN/u-GaN/SiN$_x$/u-GaN buffer layer and n-GaN buffer layer are 300 nm, 600 nm, 300 nm, 400 nm, 300 nm, 400 nm, 400 nm, 400 nm and 2 µm, respectively. Secondly, the InGaN/GaN superlattice layer and the InGaN/GaN multiple quantum well layer are grown by MOCVD at a temperature of 600° C. The InGaN/GaN superlattice layer is composed of InGaN and GaN alternately arranged for 10 periods, in each period, the GaN layer has a thickness of 48 nm and the InGaN layer has a thickness of 12 nm, and a total thickness is 600 nm. The InGaN/GaN multiple quantum well layer has 11 periods in total, and the MQW has a thickness of 220 nm, in which the GaN layer has a thickness of 13 nm and InGaN layer has a thickness of 7 nm.

(2) According to the electrode design, the InGaN/GaN multiple quantum well layer obtained in step (1) is etched by ICP to obtain a square wave groove structure with a depth of 180 nm and a width of 100 nm. A distance between the center lines of the two grooves is 400 nm, and a radius of the semicircular electrode is about 107 nm.

(3) According to the electrode design, the InGaN/GaN multiple quantum well layer with a groove structure obtained in step (2) is subjected to PECVD to deposit a Si$_3$N$_4$ passivation layer with a thickness of 10 nm.

(4) According to the electrode design, the Si$_3$N$_4$ passivation layer obtained in step (3) is photoetched by coating a sample evenly first, drying for 38 s, then exposing for 6 s, developing for 38 s, and finally treating with oxygen ion for 2.5 min.

(5) According to the electrode design, the Si$_3$N$_4$ passivation layer obtained in step (4) is evaporated, the evaporation rate is controlled to be 0.17 nm/min, Ni and Au are evaporated for 70 nm sequentially, and a groove evaporation electrode is used as an anode and a mesa evaporation electrode is used as a cathode. After taking out and cleaning, the InGaN/GaN multiple quantum well (MQW) blue light detector is obtained.

(6) The InGaN/GaN multiple quantum well (MQW) blue light detector obtained in step (5) is tested.

As shown in FIG. 1, the InGaN/GaN multiple quantum well (MQW) blue light detector prepared by this embodiment, includes the Si substrate 1, the AlN/AlGaN/GaN buffer layer 2 grown on the Si substrate 1, the u-GaN/AlN/u-GaN/SiN$_x$/u-GaN buffer layer 3 grown on the AlN/Al- GaN/GaN buffer layer 2, the n-GaN buffer layer 4 grown on the u-GaN/AlN/u-GaN/SiN$_x$/u-GaN buffer layer 3, the InGaN/GaN superlattice layer 5 grown on the n-GaN buffer layer 4, the InGaN/GaN multiple quantum well layer 6 grown on the InGaN/GaN superlattice layer 5, the Si$_3$N$_4$ passivation layer 7 grown on the InGaN/GaN multiple quantum well layer 6, and the first Ni/Au metal layer electrode 8-1 and second Ni/Au metal layer electrode 8-2 grown on the Si$_3$N$_4$ passivation layer 7.

FIG. 2 is a schematic plan view of a structure of the InGaN/GaN multiple quantum well (MQW) blue light detector of the present invention.

Figure 3:
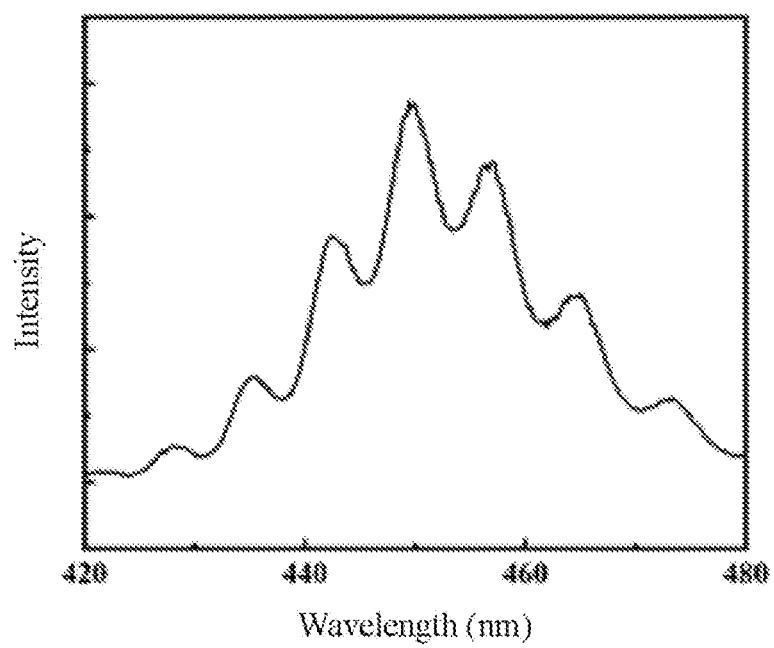
FIG. 3 is a PL curve of an InGaN/GaN multiple quantum well (MQW) blue light detector prepared in Embodiment 1.
Figure 4:
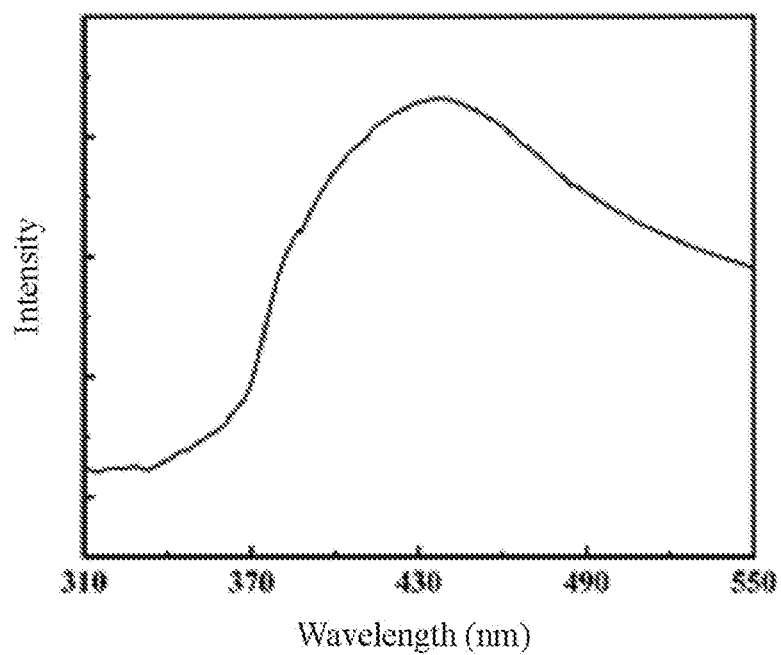
FIG. 4 is a spectral response diagram of the InGaN/GaN multiple quantum well (MQW) blue light detector prepared in Embodiment 1.

FIGS. 3 and 4 are a PL curve and a photocurrent curve measured by the InGaN/GaN multiple quantum well (MQW) blue light detector obtained in this embodiment. It can be seen from the curves that the detector has extremely high bandwidth and high responsivity of 0.74 A/W in blue band.

Embodiment 2

The InGaN/GaN multiple quantum well (MQW) blue light detector and the preparation method thereof of the embodiment include the following steps.

(1) Firstly, according to the structure design, an AlN/AlGaN/GaN buffer layer, a u-GaN/AlN/u-GaN/SiN$_x$/u-GaN buffer layer and an n-GaN buffer layer are grown at high temperature on a Si substrate by MOCVD at temperatures of 1050° C., 1050° C., 950° C., 950° C., 1050° C., 950° C., 1050° C., 950° C. and 950° C., respectively. The thin film thicknesses of the AlN/AlGaN/GaN buffer layer, u-GaN/AlN/u-GaN/SiN$_x$/u-GaN buffer layer and n-GaN buffer layer are 350 nm, 650 nm, 350 nm, 300 nm, 200 nm, 300 nm, 600 nm, 300 nm, 2.5 µm, respectively. Secondly, the InGaN/GaN superlattice layer and the InGaN/GaN multiple quantum well layer are grown by MOCVD at a temperature of 750° C. The InGaN/GaN superlattice layer is composed of InGaN and GaN alternately arranged for 10 periods, in each period, the GaN layer has a thickness of 40 nm and the InGaN layer has a thickness of 10 nm, and a total thickness is 500 nm. The InGaN/GaN multiple quantum well layer has 12 periods in total, and the MQW has a thickness of 240 nm, in which the GaN layer has a thickness of 14 nm and InGaN layer has a thickness of 6 nm.

(2) According to the electrode design, the InGaN/GaN multiple quantum well layer obtained in step (1) is etched by ICP to obtain a square wave groove structure with a depth of 190 nm and a width of 150 nm. A distance between the center lines of the two grooves is 450 nm, and a radius of the semicircular electrode is about 135 nm.

(3) According to the electrode design, the InGaN/GaN multiple quantum well layer with a groove structure obtained in step (2) is subjected to PECVD to deposit a Si$_3$N$_4$ passivation layer with a thickness of 15 nm.

(4) According to the electrode design, the InGaN/GaN multiple quantum well layer for covering the passivation layer obtained in step (3) is photoetched by coating a sample evenly first, drying for 42 s, then exposing for 8 s, developing for 42 s, and finally treating with oxygen ion for 2 min.

(5) According to the electrode design, the Si$_3$N$_4$ passivation layer obtained in step (4) is evaporated, the evaporation rate is controlled to be 0.19 nm/min, Ni and Au are evaporated for 80 nm sequentially, and a groove evaporation electrode is used as an anode and a mesa evaporation electrode is used as a cathode. After taking out and cleaning, the InGaN/GaN multiple quantum well (MQW) blue light detector is obtained.

(6) The InGaN/GaN multiple quantum well (MQW) blue light detector obtained in step (5) is tested.

The InGaN/GaN Multiple Quantum Well (MQW) blue light detector prepared in this embodiment has an effect similar to that of Embodiment 1 and will not be described here.

Embodiment 3

The InGaN/GaN multiple quantum well (MQW) blue light detector and the preparation method thereof of the embodiment include the following steps:

(1) Firstly, according to the structure design, an AlN/AlGaN/GaN buffer layer, a u-GaN/AlN/u-GaN/SiN$_x$/u-GaN buffer layer and an n-GaN buffer layer are grown at high temperature on a Si substrate by MOCVD at temperatures of 1100° C., 1100° C., 1000° C., 1000° C., 1100° C., 1000° C., 1100° C., 1000° C., 1000° C., respectively. The thin film thicknesses of the AlN/AlGaN/GaN buffer layer, u-GaN/AlN/u-GaN/SiN$_x$/u-GaN buffer layer and n-GaN buffer layer are 400 nm, 700 nm, 400 nm, 350 nm, 250 nm, 350 nm, 500 nm, 350 nm, 3 μm, respectively. Secondly, the InGaN/GaN superlattice layer and the InGaN/GaN multiple quantum well layer are grown by MOCVD at a temperature of 750° C. The InGaN/GaN superlattice layer is composed of InGaN and GaN alternately arranged for 10 periods, in each period, the GaN layer has a thickness of 42 nm and the InGaN layer has a thickness of 10 nm, and a total thickness is 520 nm. The InGaN/GaN multiple quantum well layer has 13 periods in total, and the MQW has a thickness of 260 nm, in which the GaN layer has a thickness of 14 nm and InGaN layer has a thickness of 6 nm.

(2) According to the electrode design, the InGaN/GaN multiple quantum well layer obtained in step (1) is etched by ICP to obtain a square wave groove structure with a depth of 200 nm and a width of 120 nm. A distance between the center lines of the two grooves is 420 nm, and a radius of the semicircular electrode is about 125 nm.

(3) According to the electrode design, the InGaN/GaN multiple quantum well layer with a groove structure obtained in step (2) is subjected to PECVD to deposit a Si$_3$N$_4$ passivation layer with a thickness of 12 nm.

(4) According to the electrode design, the InGaN/GaN multiple quantum well layer for covering the passivation layer obtained in step (3) is photoetched by coating a sample evenly first, drying for 45 s, then exposing for 9 s, developing for 45 s, and finally treating with oxygen ion for 3 min.

(5) According to the electrode design, the Si$_3$N$_4$ passivation layer obtained in step (4) is evaporated, the evaporation rate is controlled to be 0.21 nm/min, Ni and Au are evaporated for 90 nm sequentially, and a groove evaporation electrode is used as an anode and a mesa evaporation electrode is used as a cathode. After taking out and cleaning, the InGaN/GaN multiple quantum well (MQW) blue light detector was obtained.

(6) The InGaN/GaN multiple quantum well (MQW) blue light detector obtained in step (5) is tested.

The InGaN/GaN Multiple Quantum Well (MQW) blue light detector prepared in this embodiment has an effect similar to that of Embodiment 1 and will not be described here.

Embodiment 4

The InGaN/GaN multiple quantum well (MQW) blue light detector and the preparation method thereof of the embodiment include the following steps.

(1) Firstly, according to the structure design, an AlN/AlGaN/GaN buffer layer, a u-GaN/AlN/u-GaN/SiN$_x$/u-GaN buffer layer and an n-GaN buffer layer are grown at high temperature on a Si substrate by MOCVD at temperatures of 1075° C., 1075° C., 975° C., 975° C., 1075° C., 975° C., 1075° C., 975° C., 975° C., respectively. The thin film thicknesses of the AlN/AlGaN/GaN buffer layer, u-GaN/AlN/u-GaN/SiN$_x$/u-GaN buffer layer and n-GaN buffer layer are 375 nm, 675 nm, 375 nm, 325 nm, 225 nm, 325 nm, 625 nm, 325 nm, 2.75 μm, respectively. Secondly, the InGaN/GaN superlattice layer and the InGaN/GaN multiple quantum well layer are grown by MOCVD at a temperature of 750° C. The InGaN/GaN superlattice layer is composed of InGaN and GaN alternately arranged for 10 periods, in each period, the GaN layer has a thickness of 44 nm and the InGaN layer has a thickness of 11 nm, and a total thickness is 550 nm. The InGaN/GaN multiple quantum well layer has 9 periods in total, and the MQW has a thickness of 180 nm, in which the GaN layer has a thickness of 14 nm and InGaN layer has a thickness of 6 nm.

(2) According to the electrode design, the InGaN/GaN multiple quantum well layer obtained in step (1) is etched by ICP to obtain a square wave groove structure with a depth of 170 nm and a width of 130 nm. A distance between the center lines of the two grooves is 500 nm, and a radius of the semicircular electrode is about 120 nm.

(3) According to the electrode design, the InGaN/GaN multiple quantum well layer with a groove structure obtained in step (2) is subjected to PECVD to deposit a Si$_3$N$_4$ passivation layer with a thickness of 11 nm.

(4) According to the electrode design, the InGaN/GaN multiple quantum well layer for covering the passivation layer obtained in step (3) is photoetched by coating a sample evenly first, drying for 43 s, then exposing for 9 s, developing for 43 s, and finally treating with oxygen ion for 2 min.

(5) According to the electrode design, the Si$_3$N$_4$ passivation layer obtained in step (4) is evaporated, the evaporation rate is controlled to be 0.18 nm/min, Ni and Au are evaporated for 85 nm sequentially, and a groove evaporation electrode is used as an anode and a mesa evaporation electrode is used as a cathode. After taking out and cleaning, the InGaN/GaN multiple quantum well (MQW) blue light detector was obtained.

(6) The InGaN/GaN multiple quantum well (MQW) blue light detector obtained in step (5) is tested.

The InGaN/GaN Multiple Quantum Well (MQW) blue light detector prepared in this embodiment has an effect similar to that of Embodiment 1 and will not be described here.

The above embodiments are preferred embodiments of the present invention, but the implementation of the present invention is not limited by the above embodiments. Any other changes, modifications, substitutions, combinations and simplifications made without departing from the spirit and principle of the present invention shall be equivalence and are encompassed in the protection scope of the present invention.

What is claimed is:

1. An InGaN/GaN multiple quantum well blue light detector combined with embedded electrode and passivation layer structure, comprising: a Si substrate, an AlN/AlGaN/GaN buffer layer, a u-GaN/AlN/u-GaN/SiN$_x$/u-GaN buffer layer, an n-GaN buffer layer, an InGaN/GaN superlattice layer and an InGaN/GaN multiple quantum well layer in sequence from bottom to top, wherein the InGaN/GaN multiple quantum well layer has a groove and a mesa, the mesa and the groove of the InGaN/GaN multiple quantum well layer are provided with a $Si_3N_4$ passivation layer, the $Si_3N_4$ passivation layer in the groove is provided with a first metal layer electrode with a semicircular cross section, and the $Si_3N_4$ passivation layer on the mesa is provided with a second metal layer electrode, wherein the embedded electrode is the first metal layer electrode, and the passivation layer structure is the $Si_3N_4$ passivation layer.

2. The InGaN/GaN multiple quantum well blue light detector combined with embedded electrode and passivation layer structure according to claim 1, wherein the Si substrate has a thickness of 520 to 530 μm;

the AlN/AlGaN/GaN buffer layer comprises an AlN layer with a thickness of 300-400 nm, an AlGaN layer with a thickness of 600-700 nm and a GaN layer with a thickness of 300-400 nm;

the u-GaN/AlN/u-GaN/SiN$_x$/u-GaN buffer layer comprises a first u-GaN layer with a thickness of 300-400 nm, an AlN layer with a thickness of 200-300 nm, a second u-GaN layer with a thickness of 300-400 nm, a SiN$_x$ layer with a thickness of 400-600 nm and a third u-GaN layer with a thickness of 300-400 nm;

the n-GaN buffer layer has a thickness of 2-3 μm;

the InGaN/GaN superlattice layer has a thickness of 500-600 nm and is in an alternating arrangement structure; the InGaN/GaN multiple quantum well layer has a thickness of 170-340 nm; and the $Si_3N_4$ passivation layer has a thickness of 5-20 nm.

3. The InGaN/GaN multiple quantum well blue light detector combined with embedded electrode and passivation layer structure according to claim 1, wherein the first metal layer electrode and the second metal layer electrode are Ni/Au metal layer electrodes, the Ni/Au metal layer electrode comprising a Ni metal layer with a thickness of 70-90 nm and an Au metal layer with a thickness of 70-90 nm.

4. The InGaN/GaN multiple quantum well blue light detector combined with embedded electrode and passivation layer structure according to claim 1, wherein the InGaN/GaN multiple quantum well layer is in a form of superimposing a layer of InGaN on a layer of GaN with superimposing for 9-12 times as a period, the GaN layer with a thickness of 13-18 nm, and the InGaN layer with a thickness of 6-10 nm.

5. The InGaN/GaN multiple quantum well blue light detector combined with embedded electrode and passivation layer structure according to claim 1, wherein the first metal layer electrode and the second metal layer electrode are interdigital electrodes, the first metal layer electrode and the second metal layer electrodes being alternately arranged.

6. The InGaN/GaN multiple quantum well blue light detector combined with embedded electrode and passivation layer structure according to claim 1, wherein the groove is a strip-shaped structure with equal spacing, the groove has a width of 100-150 nm and a depth of 160-200 nm, and a distance between center lines of two grooves is 400-650 nm; the first metal layer electrode is a semicircular electrode with a cross section radius of 100-140 nm; and an overall length-width dimension of the detector is 5.2×5.2 to 8.45× 8.45 μm².

7. A preparation method of the InGaN/GaN multiple quantum well blue light detector combined with embedded electrode and passivation layer structure according to claim 1, wherein the method comprises:

step 1, growing the AlN/AlGaN/GaN buffer layer, the u-GaN/AlN/u-GaN/SiN$_x$/u-GaN buffer layer, the n-GaN buffer layer, the InGaN/GaN superlattice layer and the InGaN/GaN multiple quantum well layer on the Si substrate by MOCVD;

step 2, performing ICP etching on the InGaN/GaN multiple quantum well layer obtained in step 1 to obtain the mesa and the groove;

step 3, performing PECVD to deposit the $Si_3N_4$ passivation layer on the InGaN/GaN multiple quantum well layer with the groove obtained in step 2;

step 4, photoetching the $Si_3N_4$ passivation layer obtained in step 3 by firstly coating evenly and drying, then exposing and developing, and finally undergoing oxygen ion treatment; and step 5, evaporating the groove and the mesa of the $Si_3N_4$ passivation layer obtained in step 4, first evaporating Ni and then evaporating Au, after taking out, locally heating metal layer electrode by a resistance heating method to change a cross-sectional shape of the metal layer electrode to semicircle, and cleaning to obtain the InGaN/GaN multiple quantum well blue light detector.

8. The preparation method according to claim 7, wherein in step 2, the AlN/AlGaN/GaN buffer layer comprises an AlN layer grown at a temperature of 1000-1100° C., an AlGaN layer grown at a temperature of 1000-1100° C. and a GaN layer grown at a temperature of 900-1050° C.; the u-GaN/AlN/u-GaN/SiN$_x$/u-GaN buffer layer comprises a first u-GaN layer grown at a temperature of 900-1050° C., an AlN layer grown at a temperature of 1000-1100° C., a second u-GaN layer grown at a temperature of 900-1050° C., a SiN$_x$ layer grown at a temperature of 1000-1100° C. and a third u-GaN layer grown at a temperature of 900-1050° C.; the n-GaN buffer layer is grown at a temperature of 900-1050° C.; and the InGaN/GaN superlattice layer and the InGaN/GaN multiple quantum well layer are grown at a temperature of 550-760° C.

9. The preparation method according to claim 7, wherein in step 4, a drying time is 35-48 s, an exposure time is 4-12 s, a developing time is 35-48 s, and an oxygen ion treatment time is 1.5-3.5 min; and in step 5, a rate of the evaporation is 0.16-0.22 nm/min, and a temperature of the heating is 1455-1555° C.

10. An application of the InGaN/GaN multiple quantum well blue light detector combined with embedded electrode and passivation layer structure according to claim 1 in blue light detection.

11. An application of the InGaN/GaN multiple quantum well blue light detector combined with embedded electrode and passivation layer structure according to claim 2 in blue light detection.

12. An application of the InGaN/GaN multiple quantum well blue light detector combined with embedded electrode and passivation layer structure according to claim 3 in blue light detection.

13. An application of the InGaN/GaN multiple quantum well blue light detector combined with embedded electrode and passivation layer structure according to claim 4 in blue light detection.

14. An application of the InGaN/GaN multiple quantum well blue light detector combined with embedded electrode and passivation layer structure according to claim 5 in blue light detection.

15. An application of the InGaN/GaN multiple quantum well blue light detector combined with embedded electrode and passivation layer structure according to claim 6 in blue light detection.

* * * * *